(12) United States Patent
Choi

(10) Patent No.: US 12,385,978 B2
(45) Date of Patent: Aug. 12, 2025

(54) BATTERY PACK DIAGNOSING APPARATUS AND METHOD

(71) Applicant: LG Energy Solution, Ltd., Seoul (KR)

(72) Inventor: Jang-Hyeok Choi, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 119 days.

(21) Appl. No.: 18/030,669

(22) PCT Filed: Jan. 5, 2022

(86) PCT No.: PCT/KR2022/000165
§ 371 (c)(1),
(2) Date: Apr. 6, 2023

(87) PCT Pub. No.: WO2022/149852
PCT Pub. Date: Jul. 14, 2022

(65) Prior Publication Data
US 2023/0366940 A1    Nov. 16, 2023

(30) Foreign Application Priority Data
Jan. 8, 2021   (KR) ................. 10-2021-0002897

(51) Int. Cl.
*G01R 31/374* (2019.01)
(52) U.S. Cl.
CPC .................. *G01R 31/374* (2019.01)
(58) Field of Classification Search
CPC ............ G01R 31/374; G01R 31/396; H01M 2010/4271; H01M 2220/20; H01M 10/42; H01M 10/4207; H01M 10/425; H01M 10/482; H01M 10/486; H01M 10/48; Y02E 60/10

See application file for complete search history.

(56) References Cited

U.S. PATENT DOCUMENTS

2013/0063094 A1    3/2013  Gibbs et al.
2013/0093383 A1*   4/2013  Kim ................. H01M 10/441
                                                    320/136
2015/0349550 A1*  12/2015  Jeon ...................... B60L 58/22
                                                    320/134
(Continued)

FOREIGN PATENT DOCUMENTS

CN    110308393 A    10/2019
JP    2001313087 A   11/2001
(Continued)

OTHER PUBLICATIONS

International Search Report for PCT/KR2022/000165 mailed Apr. 19, 2022. 3 pages.

*Primary Examiner* — Akm Zakaria
(74) *Attorney, Agent, or Firm* — Lerner David LLP

(57) ABSTRACT

The present disclosure relates to a battery pack diagnosing apparatus and method, and more particularly, to a battery pack diagnosing apparatus and method capable of diagnosing a state of a battery pack. According to one aspect of the present disclosure, the battery pack diagnosing apparatus has an advantage of diagnosing the state of the battery pack in consideration of the arrangement information of the plurality of battery modules, without simply diagnosing the state of the battery pack based on the temperature of each battery module provided in the battery pack.

11 Claims, 6 Drawing Sheets

(56) References Cited

U.S. PATENT DOCUMENTS

| | | | |
|---|---|---|---|
| 2016/0204478 A1 | 7/2016 | Iguchi et al. | |
| 2016/0315363 A1 | 10/2016 | Esteghlal | |
| 2017/0054311 A1 | 2/2017 | Masias et al. | |
| 2017/0365893 A1 | 12/2017 | Kim et al. | |
| 2019/0173135 A1 | 6/2019 | Iguchi et al. | |
| 2019/0190091 A1* | 6/2019 | Kim | G01R 31/3828 |
| 2020/0072912 A1* | 3/2020 | Chun | G01R 31/396 |
| 2020/0319259 A1* | 10/2020 | Pressman | G05B 19/042 |
| 2022/0011168 A1 | 1/2022 | Kim et al. | |

FOREIGN PATENT DOCUMENTS

| | | | |
|---|---|---|---|
| JP | 2013030394 A | 2/2013 | |
| JP | 6173469 B2 | 8/2017 | |
| JP | 2017133732 A | 8/2017 | |
| JP | 6443073 B2 | 12/2018 | |
| JP | 2020-169984 A | 10/2020 | |
| KR | 20120061352 A | 6/2012 | |
| KR | 20130040575 A | 4/2013 | |
| KR | 20150137675 A | 12/2015 | |
| KR | 20160100953 A | 8/2016 | |
| KR | 101924527 B1 | 12/2018 | |
| KR | 20200024359 A | 3/2020 | |
| KR | 20200027326 A | 3/2020 | |
| KR | 20200098977 A | 8/2020 | |
| KR | 2020-0143929 A | 12/2020 | |
| WO | 2019023681 A1 | 1/2019 | |

* cited by examiner

| GROUP | BATTERY MODULE | FIRST STATE DIAGNOSIS RESULT | SECOND STATE DIAGNOSIS RESULT |
|---|---|---|---|
| FIRST GROUP (G1) | FIRST BATTERY MODULE(B1) | | |
| | SECOND BATTERY MODULE(B2) | | |
| | THIRD BATTERY MODULE(B3) | | |
| | FOURTH BATTERY MODULE(B4) | | |
| SECOND GROUP (G2) | FIFTH BATTERY MODULE(B5) | | |
| | SIXTH BATTERY MODULE(B6) | | |
| | SEVENTH BATTERY MODULE(B7) | | |
| | EIGHTH BATTERY MODULE(B8) | | |

BATTERY PACK DIAGNOSING APPARATUS AND METHOD

CROSS REFERENCE TO RELATED APPLICATIONS

The present application is a national phase entry under 35 U.S.C. § 371 of International Application No. PCT/KR2022/000165 filed Jan. 5, 2022 which claims priority to Korean Patent Application No. 10-2021-0002897 filed on Jan. 8, 2021 in the Republic of Korea, the disclosures of which are incorporated herein by reference.

TECHNICAL FIELD

The present disclosure relates to a battery pack diagnosing apparatus and method, and more particularly, to a battery pack diagnosing apparatus and method capable of diagnosing a state of a battery pack.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, lithium batteries are in the limelight since they have almost no memory effect compared to nickel-based batteries and also have very low self-charging rates and high energy density.

In general, a battery pack may include a plurality of battery modules connected in series and/or in parallel, and each battery module may include a plurality of batteries connected in series and/or in parallel.

In order to prevent ignition of the battery pack, at least one temperature sensor is provided in the battery pack to measure the temperature of the battery module and the battery cell. In addition, according to the temperature measurement value by the temperature sensor, safety measures for a high-temperature situation of the battery pack may be performed, for example, by opening a main relay provided on a charging/discharging path (large current path) or adjusting an output power of the battery pack.

However, since the structure of the battery pack is designed in various ways for high capacity and/or high output, if safety measures are performed by simply comparing the temperature measurement value with a threshold value, a problem that the battery pack cannot be used in an unexpected situation may occur. Therefore, in consideration of the structure of the battery pack, it is required to develop a technology capable of recognizing a high-temperature situation of the battery pack and performing appropriate safety measures against it.

SUMMARY

Technical Problem

The present disclosure is designed to solve the problems of the related art, and therefore the present disclosure is directed to providing a battery pack diagnosing apparatus and method for measuring the temperature inside a battery pack in consideration of the structure of the battery pack and diagnosing a state of the battery pack according to the measured temperature.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery pack diagnosing apparatus according to one aspect of the present disclosure is a battery pack diagnosing apparatus for diagnosing a state of a battery pack including a plurality of battery modules, and may comprise a processor and memory having programmed thereon instructions that, when executed, are configured to cause the processor to measure a temperature of each of the plurality of battery modules through at least one temperature sensor attached to each of the plurality of battery modules; classify the plurality of battery modules into at least one group based on arrangement information for the plurality of battery modules; diagnose a first state of each of the plurality of battery modules based on the measured temperature of each of the plurality of battery modules and a threshold temperature set for each group to which the corresponding battery module belongs; set a representative temperature for each classified group; diagnose a second state of each of the plurality of battery modules based on the temperature of the battery module belonging to each group and the representative temperature; and diagnose a state of the battery pack according to a diagnosis result for the first state and a diagnosis result for the second state.

The instructions may be configured to cause the processor to classify the plurality of battery modules into a plurality of groups depending on whether the plurality of battery modules are arranged in a stacked structure.

As the diagnosis result for the first state, the instructions may be configured to cause the processor to determine a temperature sensor whose measured temperature is equal to or higher than the threshold temperature among the temperature sensors attached to each of the plurality of battery modules as a first target sensor.

The instructions may be configured to cause the processor to set the threshold temperature corresponding to a group including a battery module arranged in the stacked structure to be higher than the threshold temperature corresponding to a group including a battery module not arranged in the stacked structure.

As the diagnosis result for the second state, the instructions may be configured to cause the processor to determine a temperature sensor whose deviation between the measured temperature and the representative temperature is equal to or greater than a threshold deviation among the temperature sensors attached to each of the plurality of battery modules as a second target sensor.

The instructions may be configured to cause the processor to set the threshold deviation corresponding to a group including a battery module arranged in the stacked structure to be lower than the threshold deviation corresponding to a group including a battery module not arranged in the stacked structure.

The instructions may be configured to cause the processor to diagnose the state of the battery pack as a defective state, when there is a battery module in which the sum of the number of first target sensors and the number of second target sensors is equal to or greater than a first criterion number among the plurality of battery modules.

The instructions may be configured to cause the processor to diagnose the state of the battery pack as a defective state, when there is a group in which the sum of the number of first target sensors and the number of second target sensors corresponding to the plurality of battery modules belonging to the corresponding group is equal to or greater than a second criterion number among the classified groups.

The temperature sensor may be provided in plural to be attached to each of the plurality of battery modules.

The instructions may be configured to cause the processor to measure a plurality of temperatures for the plurality of battery modules, respectively, through the temperature sensors.

A battery pack according to another aspect of the present disclosure may comprise the battery pack diagnosing apparatus according to one aspect of the present disclosure.

A battery pack diagnosing method according to yet another aspect of the present disclosure is a battery pack diagnosing method for diagnosing a state of a battery pack including a plurality of battery modules, and may comprise measuring, by a processor, a temperature of each of the plurality of battery modules through at least one temperature sensor attached to each of the plurality of battery modules; classifying, by the processor, the plurality of battery modules into at least one group based on arrangement information for the plurality of battery modules; t diagnosing, by the processor, a first state of each of the plurality of battery modules based on the temperature of each of the plurality of battery modules measured in the temperature measuring step and a threshold temperature set for each group to which the corresponding battery module belongs; setting, by the processor, a representative temperature for each group classified in the group classifying step; diagnosing, by the processor, a second state of each of the plurality of battery modules based on the temperature of the battery module belonging to each group and the representative temperature; and diagnosing, by the processor, a state of the battery pack according to a diagnosis result of the first state diagnosing step and a diagnosis result of the second state diagnosing step.

Advantageous Effects

According to one aspect of the present disclosure, the battery pack diagnosing apparatus has an advantage of diagnosing the state of the battery pack in consideration of the arrangement information of the plurality of battery modules, without simply diagnosing the state of the battery pack based on the temperature of each battery module provided in the battery pack.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
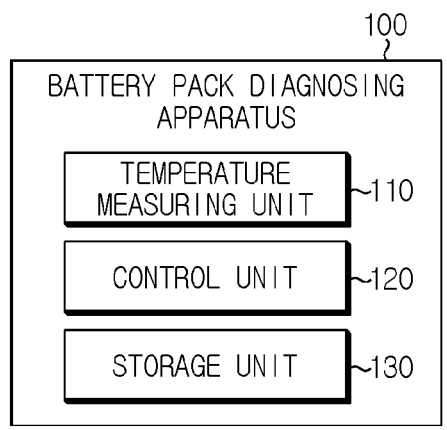
FIG. 1 is a diagram schematically showing a battery pack diagnosing apparatus according to an embodiment of the present disclosure.

FIG. 1 is a diagram schematically showing a battery pack diagnosing apparatus 100 according to an embodiment of the present disclosure.

Referring to FIG. 1, the battery pack diagnosing apparatus 100 may include a temperature measuring unit 110 and a control unit 120.

Specifically, the battery pack diagnosing apparatus 100 may be a battery pack diagnosing apparatus 100 for diagnosing a state of a battery pack including a plurality of battery modules.

For example, at least one battery module may be provided in the battery pack. Also, the battery module may include one or more battery cells. In addition, the battery cell means a physically separable one independent cell having a negative electrode terminal and a positive electrode terminal. For example, one pouch-type lithium ion battery may be regarded as a battery cell.

Hereinafter, it is assumed that the battery pack includes a plurality of battery modules, and each battery module includes a plurality of battery cells. However, it should be noted that the number of battery modules and battery cells included in the battery pack is not limited by the described embodiment, and, for example, the battery pack may include a plurality of battery modules, each including only one battery cell.

The temperature measuring unit 110 may be configured to measure the temperature of each of the plurality of battery modules through at least one temperature sensor attached to each of the plurality of battery modules.

Specifically, one temperature sensor or a plurality of temperature sensors may be attached to each of the plurality of battery modules. The number of temperature sensors attached to each of the plurality of battery modules may be different or the same for each battery module. Preferably, in order to accurately diagnose the state of the battery pack, the same number of temperature sensors may be attached to the plurality of battery modules.

Preferably, in order to more accurately diagnose the state of the battery pack, a plurality of temperature sensors may be configured to be attached to each of the plurality of battery modules. In addition, the temperature measuring unit 110 may be configured to measure a plurality of temperatures for each of the plurality of battery modules through the temperature sensors.

Hereinafter, it is assumed that the battery pack includes a total of eight battery modules, and four temperature sensors are attached to each battery module. However, it should be noted that the number of battery modules included in the battery pack and the number of temperature sensors attached to each battery module may be changed within an unrestricted range.

For example, the temperature measuring unit 110 may measure a total of 32 temperatures by using four temperature sensors attached to each of the eight battery modules. That is, the temperature measuring unit 110 may measure four temperatures for each battery module.

The control unit 120 may be connected to the temperature measuring unit 110 by wire or wirelessly so as to communicate with the temperature measuring unit 110. Accordingly, the control unit 120 may receive the temperatures of the plurality of battery modules measured by the temperature measuring unit 110.

Also, the control unit 120 may be configured to classify the plurality of battery modules into at least one group based on arrangement information for the plurality of battery modules.

Here, the arrangement information for the plurality of battery modules may mean design information in which a plurality of battery modules are arranged inside the battery pack. In addition, the battery modules may be arranged in a stacked structure or an in-line structure. The stacked structure may mean a structure in which a plurality of battery modules are stacked layer by layer based on the lower portion of the battery pack. The in-line structure may mean a structure in which lower portions of the plurality of battery modules are fixed to a lower portion of the battery pack, and side surfaces of the plurality of battery modules are connected with each other.

Specifically, the control unit 120 may be configured to classify the plurality of battery modules into a plurality of groups depending on whether the plurality of battery modules are arranged in a stacked structure.

For example, the control unit 120 may be configured to classify battery modules arranged in a stacked structure among the plurality of battery modules into a first group G1, and classify adjacent battery modules not arranged in a stacked structure among the plurality of battery modules into a second group G2.

That is, the control unit 120 may classify the battery modules arranged in a stacked structure into the first group G1, and classify the battery modules arranged in an in-line structure into the second group G2. Here, the battery module may be classified only in one group, and may not be classified into two or more groups in duplicate.

Figure 2:
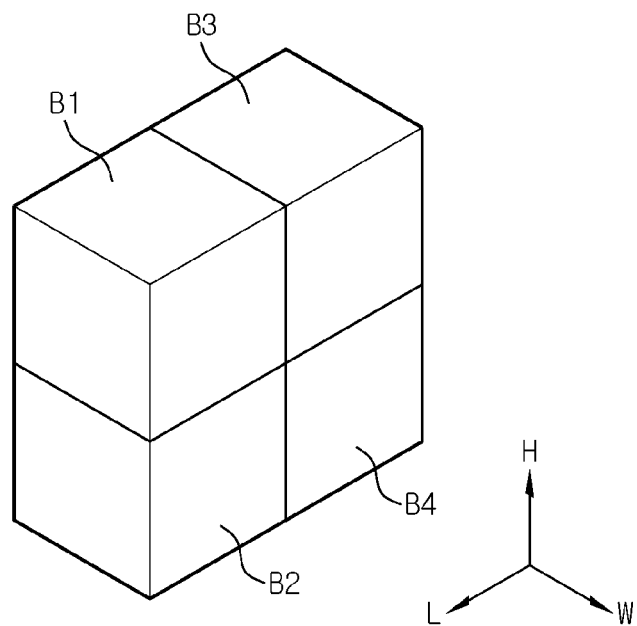
FIG. 2 is a diagram showing an example of an arrangement structure of a battery module according to an embodiment of the present disclosure.
Figures 3, 4:
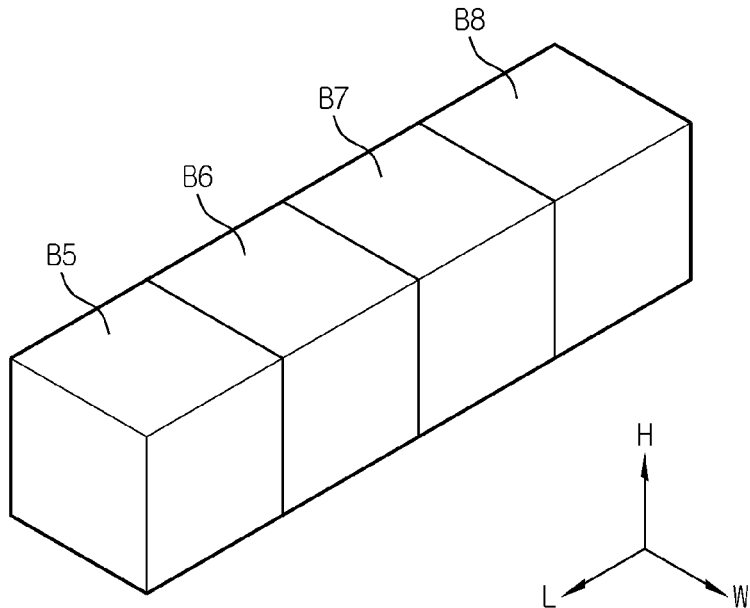
FIG. 3 is a diagram showing another example of the arrangement structure of the battery module according to an embodiment of the present disclosure.
FIG. 4 is a diagram showing an exemplary configuration of a state diagnosis table according to an embodiment of the present disclosure.

FIG. 2 is a diagram showing an example of an arrangement structure of a battery module according to an embodiment of the present disclosure. FIG. 3 is a diagram showing another example of the arrangement structure of the battery module according to an embodiment of the present disclosure.

For example, referring to FIGS. 2 and 3, among the eight battery modules, first to fourth battery modules B1 to B4 may be arranged in a stacked structure, and fifth to eighth battery modules B5 to B8 may be arranged in an in-line structure.

Specifically, if the arrangement structure of the battery modules is described in the form of "length direction (L)× width direction (W)×height direction (H)", the first to fourth battery modules B1 to B4 may be stacked in a 2×1×2 structure, and the fifth to eighth battery modules B5 to B8 may be arranged in line in the structure of 4×1×1.

The control unit 120 may classify the first to fourth battery modules B1 to B4 into the first group G1, and classify the fifth to eighth battery modules B5 to B8 into the second group G2.

The control unit 120 may be configured to diagnose the first state of each of the plurality of battery modules based on the temperature of each of the plurality of battery modules measured by the temperature measuring unit 110 and a threshold temperature set for each group to which the corresponding battery module belongs.

Specifically, the threshold temperature may be set differently for each group. That is, the control unit 120 may be configured to set the threshold temperature corresponding to the first group G1 to be higher than the threshold temperature corresponding to the second group G2.

That is, the control unit 120 may be configured to set the threshold temperature corresponding to the group including the battery modules arranged in the stacked structure to be higher than the threshold temperature corresponding to the group including the battery modules not arranged in the stacked structure.

Since the first group G1 includes battery modules arranged in a stacked structure, heat transfer between the arranged battery modules may occur more actively than battery modules arranged in an in-line structure. That is, the battery modules arranged in a stacked structure may be more affected by the temperature of other battery modules belonging to the same group in terms of temperature than the battery modules arranged in an in-line structure. Accordingly, since the battery modules arranged in a stacked structure may have a higher temperature than the battery modules arranged in an in-line structure, the control unit 120 may set the threshold temperature corresponding to the first group G1 to be higher than the threshold temperature corresponding to the second group G2.

For example, the threshold temperature corresponding to the first group G1 may be set to 55° C., and the threshold temperature corresponding to the second group G2 may be set to 50° C.

Specifically, as a diagnosis result for the first state, the control unit 120 may be configured to determine a temperature sensor having a measured temperature equal to or higher than the threshold temperature among the temperature sensors attached to each of the plurality of battery modules as the first target sensor.

For example, when four temperature sensors are attached to each of the eight battery modules as in the previous embodiment, the total number of temperature sensors provided in the battery pack may be 32. The control unit 120 may determine a temperature sensor having a measured temperature equal to or higher than the corresponding threshold temperature among 32 temperature sensors as the first target sensor.

Here, the control unit 120 may compare the measured temperature with the threshold temperature corresponding to the first group G1 for 16 temperature sensors attached to the four battery modules included in the first group G1, and compare the measured temperature with the threshold temperature corresponding to the second group G2 for 16 temperature sensors attached to the four battery modules included in the second group G2.

In addition, the control unit 120 may be configured to set a representative temperature for each classified group.

For example, the control unit 120 may calculate an average value or median value of the measured temperatures for the classified group, and set the calculated average or median value as a representative temperature.

In addition, the control unit 120 may be configured to diagnose the second state of each of the plurality of battery modules based on the temperature of the battery module belonging to each group and the representative temperature.

Specifically, as a diagnosis result for the second state, the control unit 120 may be configured to determine a temperature sensor in which a deviation between the measured temperature and the representative temperature is greater than or equal to a threshold deviation among the temperature sensors attached to each of the plurality of battery modules as a second target sensor.

That is, the control unit 120 may determine the first target sensor by comparing the measured temperature of the battery module and the threshold temperature of the corresponding group in terms of each battery module. In addition, the control unit 120 may determine the second target sensor by comparing the measured temperature of the battery module and the representative temperature of the corresponding group in terms of the classified group.

Also, the control unit 120 may be configured to set the threshold deviation corresponding to the first group G1 to be lower than the threshold deviation corresponding to the second group G2.

That is, the control unit 120 may be configured to set the threshold deviation corresponding to the group including the battery modules arranged in the stacked structure to be lower than the threshold deviation corresponding to the group including the battery modules not arranged in the stacked structure.

For example, as described above, heat transfer between the plurality of battery modules included in the first group G1 may occur more actively than heat transfer between the plurality of battery modules included in the second group G2. Therefore, considering the arrangement information of the plurality of battery modules, since the temperature difference between the plurality of battery modules included in the first group G1 appears to be lower than the temperature difference between the plurality of battery modules included in the second group G2, the control unit 120 may set the threshold deviation corresponding to the first group G1 to be lower than the threshold deviation corresponding to the second group G2.

For example, the threshold deviation corresponding to the first group G1 may be 5° C., and the threshold deviation corresponding to the second group G2 may be 10° C.

The control unit 120 may be configured to diagnose the state of the battery pack according to the diagnosis result for the first state and the diagnosis result for the second state.

For example, the control unit 120 may diagnose the state of the battery pack as a defective state or a normal state.

The control unit 120 may be configured to diagnose the state of the battery pack as a defective state, when there is a battery module in which the sum of the number of first target sensors and the number of second target sensors is equal to or greater than a first criterion number among the plurality of battery modules.

In addition, the control unit 120 may be configured to diagnose the state of the battery pack as a defective state, when there is a group in which the sum of the number of first target sensors and the number of second target sensors corresponding to the plurality of battery modules belonging to the corresponding group among the classified groups is equal to or greater than a second criterion number.

Finally, the control unit 120 may be configured to diagnose the state of the battery pack as a normal state, when there is no battery module in which the sum of the number of corresponding first target sensors and the number of corresponding second target sensors among the plurality of battery modules is equal to or greater than the first criterion number and there is no group in which the sum of the number of first target sensors and the number of second target sensors corresponding to the plurality of battery modules belonging to the corresponding group among the classified groups is equal to or greater than the second criterion number.

FIG. 4 is a diagram showing an exemplary configuration of a state diagnosis table according to an embodiment of the present disclosure.

The control unit 120 may record the first state diagnosis result and the second state diagnosis result in various ways and diagnose the state of the battery pack. For example, as in the embodiment of FIG. 4, the control unit 120 may record the first state diagnosis result and the second state diagnosis result in a state diagnosis table and diagnose the state of the battery pack.

The embodiment of FIG. 4 is an embodiment in which the first to eighth battery modules B1 to B8 are included in the battery pack, the first to fourth battery modules B1 to B4 are classified into the first group G1, and the fifth to eighth battery modules B5 to B8 are classified into the second group G2, like the previous embodiment.

Figure 5:
FIG. 5 is a diagram schematically showing an example of the state diagnosis table according to an embodiment of the present disclosure.
Figure 6:
FIG. 6 is a diagram schematically showing another example of the state diagnosis table according to an embodiment of the present disclosure.

In FIGS. 5 and 6 below, a specific embodiment in which the control unit 120 diagnoses the state of the battery pack based on the state diagnosis table of FIG. 4 will be described.

FIG. 5 is a diagram schematically showing an example of the state diagnosis table according to an embodiment of the present disclosure.

In the embodiment of FIG. 5, the first state diagnosis result for the first battery module B1 may be 1, and the second state diagnosis result may be 2. That is, the number of temperature sensors determined as the first target sensor among the temperature sensors attached to the first battery module B1 may be 1, and the number of temperature sensors determined as the second target sensor may be 2. Specifically, among the temperature sensors attached to the first battery module B1, there may be one temperature sensor whose measured temperature is equal to or higher than the threshold temperature set to correspond to the first group G1. In addition, among the temperature sensors attached to the first battery module B1, there may be two temperature sensors whose measured temperature is equal to or higher than the representative temperature set to correspond to the first group G1.

Both the first state diagnosis result and the second state diagnosis result for the second to fifth battery modules B2 to B5 may be 0 (zero).

The first state diagnosis result for the sixth battery module B6 may be 0, and the second state diagnosis result may be 1. That is, among the temperature sensors attached to the sixth battery module B6, there may be no temperature sensor having a measured temperature equal to or higher than the threshold temperature set to correspond to the second group G2. However, among the temperature sensors attached to the sixth battery module B6, there may be one temperature sensor having a measured temperature equal to or higher than the representative temperature set to correspond to the second group G2.

The first state diagnosis result for the seventh battery module B7 may be 1, and the second state diagnosis result may be 0. That is, among the temperature sensors attached to the seventh battery module B7, there may be one temperature sensor having a measured temperature equal to or higher than the threshold temperature set to correspond to the second group G2. However, among the temperature sensors attached to the seventh battery module B7, there may be no temperature sensor having a measured temperature equal to or higher than the representative temperature set to correspond to the second group G2.

The first state diagnosis result for eighth battery module B8 may be 2, and the second state diagnosis result may be 0. That is, among the temperature sensors attached to the eighth battery module B8, there may be two temperature sensors having a measured temperature equal to or higher than the threshold temperature set to correspond to the second group G2. However, among the temperature sensors attached to the eighth battery module B8, there may be no temperature sensor having a measured temperature equal to or higher than the representative temperature set to correspond to the second group G2.

For example, in the embodiment of FIG. 5, it is assumed that the first criterion number is preset to 3, and the second criterion number is preset to 6.

The sum of the number of first target sensors and the number of second target sensors for the first battery module B1 may be 3. Also, the sum of the number of first target sensors and the number of second target sensors for the first group G1 may be 3.

The sum of the number of first target sensors and the number of second target sensors for the sixth battery module B6 may be 1, the sum of the number of first target sensors and the number of second target sensors for the seventh battery module B7 may be 1, and the sum of the number of first target sensors and the number of second target sensors for the eighth battery module B8 may be 2. Also, the sum of the number of first target sensors and the number of second target sensors for the second group G2 may be 4.

That is, in the embodiment of FIG. 5, since the sum of the number of first target sensors and the number of second target sensors for the first battery module B1 is equal to or greater than the first criterion number, the control unit 120 may diagnose the state of the battery pack as a defective state. The control unit 120 may specifically diagnose that the state of the battery pack is a defective state due to the first battery module B1 belonging to the first group G1.

FIG. 6 is a diagram schematically showing another example of the state diagnosis table according to an embodiment of the present disclosure.

In the embodiment of FIG. 6, the first state diagnosis result for the first battery module B1 may be 0, and the second state diagnosis result may be 2. That is, among the temperature sensors attached to the first battery module B1, the number of temperature sensors determined as the first target sensor may be 0, and the number of temperature sensors determined as the second target sensor may be 2.

The first state diagnosis result for the second battery module B2 may be 0, and the second state diagnosis result may be 2. That is, the number of temperature sensors determined as the first target sensor among the temperature sensors attached to the second battery module B2 may be 0, and the number of temperature sensors determined as the second target sensor may be 2.

The first state diagnosis result for the third battery module B3 may be 1, and the second state diagnosis result may be 1. That is, the number of temperature sensors determined as the first target sensor among the temperature sensors attached to the second battery module B2 may be 1, and the number of temperature sensors determined as the second target sensor may be 1.

The first state diagnosis result for the fourth battery module B4 may be 1, and the second state diagnosis result may be 0. That is, the number of temperature sensors determined as the first target sensor among the temperature sensors attached to the fourth battery module B4 may be 1, and the number of temperature sensors determined as the second target sensor may be 0.

Both the first state diagnosis result and the second state diagnosis result for the fifth battery module B5 may be 0.

The first state diagnosis result for the sixth battery module B6 may be 0, and the second state diagnosis result may be 1. That is, the number of temperature sensors determined as the first target sensor among the temperature sensors attached to the sixth battery module B6 may be 0, and the number of temperature sensors determined as the second target sensor may be 1.

The first state diagnosis result for the seventh battery module B7 may be 1, and the second state diagnosis result may be 0. That is, the number of temperature sensors determined as the first target sensor among the temperature sensors attached to the seventh battery module B7 may be 1, and the number of temperature sensors determined as the second target sensor may be 0.

The first state diagnosis result for eighth battery module B8 may be 2, and the second state diagnosis result may be 0. That is, the number of temperature sensors determined as the first target sensor among the temperature sensors attached to the eighth battery module B8 may be 2, and the number of temperature sensors determined as the second target sensor may be 0.

For example, it is assumed that the first criterion number is preset to 3 and the second criterion number is preset to 6 in the embodiment of FIG. 6, like in the embodiment of FIG. 5.

Among the first to fourth battery modules B1 to B4, a battery module in which the sum of the number of first target sensors and the number of second target sensors is greater than or equal to the first criterion number may not exist. However, the sum of the number of first target sensors and the number of second target sensors for the first group G1 may be 7. That is, the sum of the number of first target sensors and the number of second target sensors for the first group G1 may be greater than the second criterion number.

Among the fifth to eighth battery modules B5 to B8, a battery module in which the sum of the number of first target sensors and the number of second target sensors is greater than or equal to the first criterion number may not exist. Also, the sum of the number of first target sensors and the number of second target sensors for the second group G2 may be 4. That is, the sum of the number of first target sensors and the number of second target sensors for the second group G2 may be smaller than the second criterion number.

That is, in the embodiment of FIG. 6, since the sum of the number of first target sensors and the number of second target sensors corresponding to the first group G1 is equal to or greater than the first criterion number, the control unit 120 may diagnose the state of the battery pack as a defective state. The control unit 120 may specifically diagnose that the state of the battery pack is a defective state due to the first battery module B1 belonging to the first group G1.

The battery pack diagnosing apparatus 100 according to an embodiment of the present disclosure does not simply diagnose the state of the battery pack based on the temperature of each battery module provided in the battery pack, but has an advantage of diagnosing the state of the battery pack in consideration of the arrangement information and the temperatures of the plurality of battery modules together.

In addition, the battery pack diagnosing apparatus 100 may primarily diagnose the state of the battery pack based on the temperature of each battery module in the unit of battery module, and secondarily diagnose the state of the battery pack based on the temperatures of the plurality of battery modules included in the group in the unit of group. That is, since the battery pack diagnosing apparatus 100 may diagnose the state of the battery pack complementary in terms of each battery module and each group, the state of the battery pack may be diagnosed more accurately, and the state diagnosis result of the battery pack may be more reliable.

Meanwhile, the control unit 120 provided to the battery pack diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 120 may be implemented as a set of program modules. At this time, the program module may be stored in memory and executed by the control unit 120. The memory may be provided in or out of the control unit 120, and may be connected to the control unit 120 by various well-known means.

In addition, the battery pack diagnosing apparatus 100 may further include a storage unit 130. The storage unit 130 may store data or programs necessary for operation and function of each component of the battery pack diagnosing apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the state diagnosis table according to the embodiment of FIG. 4 may be stored in advance in the storage unit 130. In addition, the control unit 120 may diagnose the state of the battery pack while recording the first state diagnosis result and the second state diagnosis result for each battery module in the state diagnosis table. In addition, the storage unit 130 may store set temperatures used in the process of diagnosing the state of the battery pack, such as the threshold temperature, the threshold deviation and the representative temperature.

Also, the arrangement information of the plurality of battery modules considered by the control unit 120 may include information on the number of the plurality of battery modules as well as the arrangement structure of the plurality of battery modules.

For example, unlike the previous embodiment, it is assumed that 54 battery modules are included in the battery pack. Also, it is assumed that among 54 battery modules, 9 battery modules are arranged in a 3×3×1 structure, 18 battery modules are arranged in a 3×3×2 structure, and 27 battery modules are arranged in a 3×3×3 structure.

When the arrangement structure of the battery module is described in the form of "length direction (L)×width direction (W)×height direction (H)" with reference to FIGS. 2 and 3, 9 battery modules may be arranged in one layer in a 3×3 structure, 18 battery modules may be arranged in two layers in a 3×3 structure, and 27 battery modules may be arranged in three layers in a 3×3 structure.

Here, the control unit 120 may classify 9 battery modules into the first group, classify 18 battery modules into the second group, and classify 27 battery modules into the third group according to the arrangement information.

In addition, the control unit 120 may set the threshold temperature and the threshold deviation differently according to the number of battery modules included in each group.

For example, the control unit 120 may set the threshold temperature corresponding to the third group to be highest and set the threshold temperature corresponding to the first group to be lowest in consideration of thermal conductivity according to the arrangement structure. In addition, the control unit 120 may set the threshold deviation corresponding to the first group to be the largest and set the threshold deviation corresponding to the third group to the smallest in consideration of the thermal conductivity according to the arrangement structure.

The battery pack diagnosing apparatus 100 according to the present disclosure may be applied to a BMS (Battery Management System). That is, the BMS according to the present disclosure may include the battery pack diagnosing apparatus 100 described above. In this configuration, at least some components of the battery pack diagnosing apparatus 100 may be implemented by supplementing or adding functions of the configuration included in the conventional BMS. For example, the temperature measuring unit 110, the control unit 120 and the storage unit 130 of the battery pack diagnosing apparatus 100 may be implemented as components of the BMS.

In addition, the battery pack diagnosing apparatus 100 according to the present disclosure may be provided to a battery pack. That is, the battery pack according to the present disclosure may include the battery pack diagnosing apparatus 100 and at least one battery cell. In addition, the battery pack may further include electrical equipment (a relay, a fuse, etc.) and a case.

Figure 7:
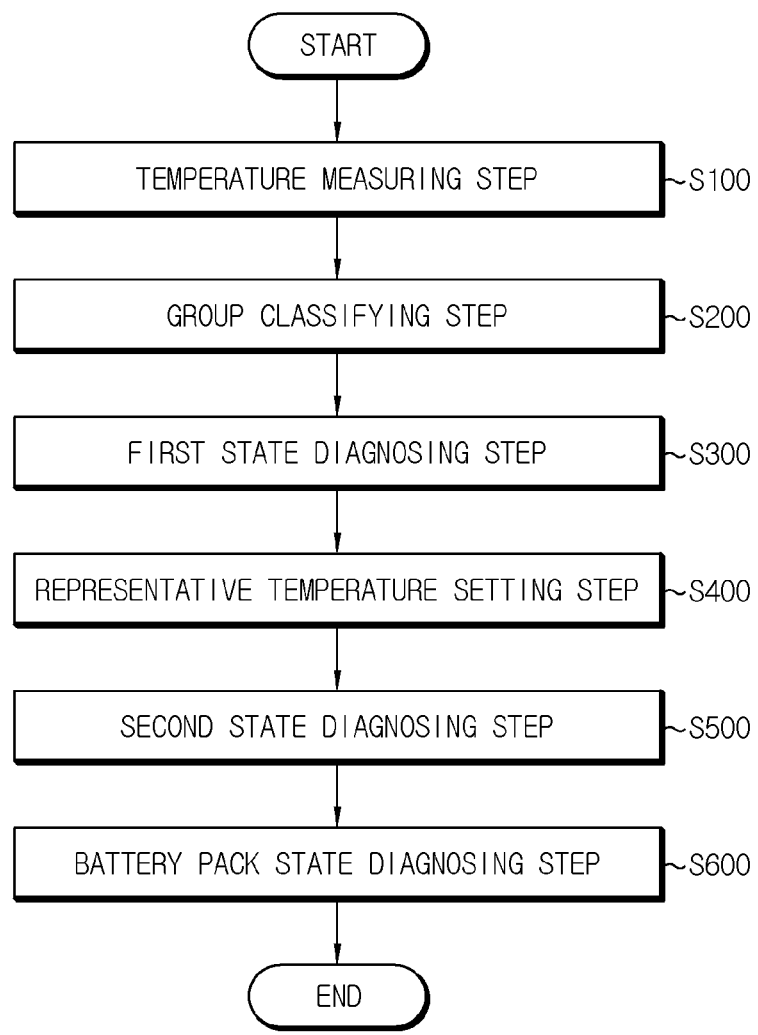
FIG. 7 is a diagram schematically showing a battery pack diagnosing method according to another embodiment of the present disclosure.

FIG. 7 is a diagram schematically showing a battery pack diagnosing method according to another embodiment of the present disclosure.

Specifically, the battery pack diagnosing method may be a battery pack diagnosing method for diagnosing a state of a battery pack including a plurality of battery modules. In addition, each step of the battery pack diagnosing method may be performed by the battery pack diagnosing apparatus 100.

Hereinafter, for convenience of explanation, content overlapping with the previously described content will be omitted or briefly described.

Referring to FIG. 7, the battery pack diagnosing method may include a temperature measuring step (S100), a group classifying step (S200), a first state diagnosing step (S300), a representative temperature setting step (S400), a second state diagnosing step (S500) and a battery pack state diagnosing step (S600).

In the embodiment of FIG. 7, the group classifying step (S200) is shown to be performed after the temperature measuring step (S100), but the temperature measuring step (S100) and the group classifying step (S200) are parallel to each other, and their orders may be changed. For example, in another embodiment, the temperature measuring step (S100) may be performed after the group classifying step (S200) is performed first.

In addition, in the embodiment of FIG. 7, it is shown that the representative temperature setting step (S400) and the second state diagnosing step (S500) are performed after the first state diagnosing step (S300), but the first state diagnosing step (S300) is parallel to the representative temperature setting step (S400) and the second state diagnosing step (S500), and their orders may be changed. For example, in another embodiment, the first state diagnosing step (S300) may be performed after the representative temperature setting step (S400) and the second state diagnosing step (S500) are performed. However, it should be noted that the second state diagnosing step (S500) cannot be performed earlier than the representative temperature setting step (S400).

The temperature measuring step (S100) is a step of measuring the temperature of each of the plurality of battery modules through at least one temperature sensor attached to each of the plurality of battery modules, and may be performed by the temperature measuring unit 110.

The group classifying step (S200) is a step of classifying the plurality of battery modules into at least one group based on the arrangement information for the plurality of battery modules, and may be performed by the control unit 120.

The first state diagnosing step (S300) is a step of diagnosing a first state of each of the plurality of battery modules based on the temperature of each of the plurality of battery modules measured in the temperature measuring step (S100) and a threshold temperature set for each group to which the corresponding battery module belongs, and may be performed by the control unit 120.

The representative temperature setting step (S400) is a step of setting a representative temperature for each group classified in the group classifying step (S200), and may be performed by the control unit 120.

The second state diagnosing step (S500) is a step of diagnosing a second state of each of the plurality of battery modules based on the temperature of the battery module belonging to each group and the representative temperature, and may be performed by the control unit 120.

The battery pack state diagnosing step (S600) is a step of diagnosing the state of the battery pack according to the diagnosis result of the first state diagnosing step (S300) and the diagnosis result of the second state diagnosing step (S500), and may be performed by the control unit 120.

The battery pack state diagnosing step (S600) will be described in more detail with reference to FIG. 8.

Figure 8:
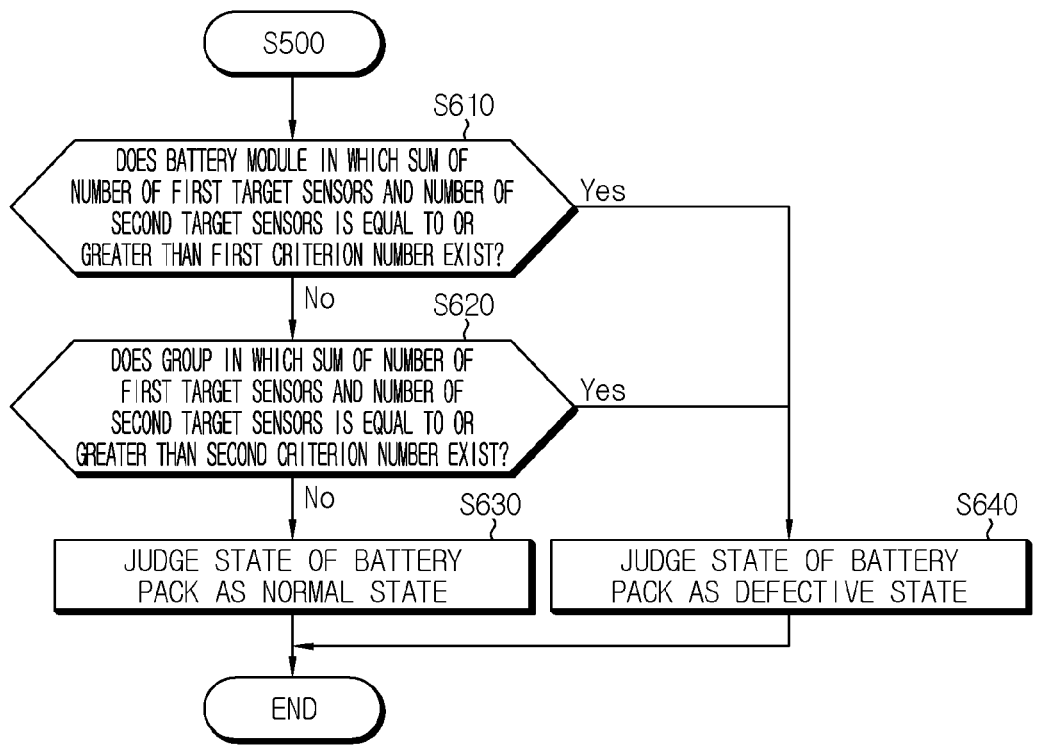
FIG. 8 is a diagram specifically showing a battery pack state diagnosing step in the battery pack diagnosing method according to another embodiment of the present disclosure.

FIG. 8 is a diagram specifically showing the battery pack state diagnosing step (S600) in the battery pack diagnosing method according to another embodiment of the present disclosure.

Referring to FIG. 8, the battery pack state diagnosing step (S600) may include Step S610 to Step S640.

In Step S610, it may be judged whether a battery module in which the sum of the number of first target sensors and the number of second target sensors is equal to or greater than the first criterion number exists among the plurality of battery modules included in the battery pack. If the determination result of the control unit 120 in Step S610 is NO, Step S620 may proceed. Conversely, if the determination result of the control unit 120 in Step S610 is YES, Step S640 may proceed.

In Step S620, it may be judged whether a group in which the sum of the number of first target sensors and the number of second target sensors is equal to or greater than the second criterion number exists among the plurality of groups. If the determination result of the control unit 120 in Step S620 is NO, Step S630 may proceed. Conversely, if the determination result of the control unit 120 in Step S620 is YES, Step S640 may proceed.

In Step S630, the control unit 120 may determine the state of the battery pack as a normal state.

That is, the control unit 120 may be configured to diagnose the state of the battery pack as a normal state, when there is no battery module in which the sum of the number of corresponding first target sensors and the number of second target sensors among the plurality of battery modules is equal to or greater than the first criterion number and there is no group in which the sum of the number of first target sensors and the number of second target sensors corresponding to the plurality of battery modules belonging to the corresponding group among the classified groups is equal to or greater than the second criterion number.

In step S640, the control unit 120 may determine the state of the battery pack as a defective state.

That is, the control unit 120 may be configured to diagnose the state of the battery pack as a defective state, when there is a battery module in which the sum of the number of corresponding first target sensors and the number of corresponding second target sensors is equal to or greater than the first criterion number among the plurality of battery modules.

In addition, the control unit 120 may be configured to diagnose the state of the battery pack as a defective state, when there is a group in which the sum of the number of first target sensors and the number of second target sensors corresponding to the plurality of battery modules belonging to the corresponding group among the classified groups is equal to or greater than the second criterion number.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery pack diagnosing apparatus
110: temperature measuring unit
120: control unit
130: storage unit

What is claimed is:

1. A battery pack diagnosing apparatus, which diagnoses a state of a battery pack including a plurality of battery modules, the apparatus comprising:
a processor; and
non-transitory memory having programmed thereon instructions that, when executed, are configured to cause the processor to:
measure a temperature of each of the plurality of battery modules through at least one temperature sensor attached to each of the plurality of battery modules;
classify the plurality of battery modules into at least one group based on arrangement information for the plurality of battery modules;
diagnose a first state of each of the plurality of battery modules based on the measured temperature of each of the plurality of battery modules and a threshold temperature set for each group to which the corresponding battery module belongs;
set a representative temperature for each classified group based on temperatures of battery modules of the plurality of battery modules belonging to the group;
diagnose a second state of each of the plurality of battery modules based on the temperature of the battery module and the representative temperature of the group to which the battery module belongs; and
diagnose a state of the battery pack according to a diagnosis result for the first state and a diagnosis result for the second state.

2. The battery pack diagnosing apparatus according to claim 1,
wherein the plurality of battery modules are classified into a plurality of groups depending on whether the plurality of battery modules are arranged in a stacked structure.

3. The battery pack diagnosing apparatus according to claim 2,
wherein as the diagnosis result for the first state, the instructions are configured to cause the processor to determine a temperature sensor whose measured temperature is equal to or higher than the threshold temperature among the temperature sensors attached to each of the plurality of battery modules as a first target sensor.

4. The battery pack diagnosing apparatus according to claim 3,
wherein the threshold temperature corresponding to a group including a battery module arranged in the stacked structure is set to be higher than the threshold temperature corresponding to a group including a battery module not arranged in the stacked structure.

5. The battery pack diagnosing apparatus according to claim 3,
wherein as the diagnosis result for the second state, the instructions are configured to cause the processor to determine a temperature sensor whose deviation between the measured temperature and the representative temperature is equal to or greater than a threshold deviation among the temperature sensors attached to each of the plurality of battery modules as a second target sensor.

6. The battery pack diagnosing apparatus according to claim 5,
wherein the threshold deviation corresponding to a group including a battery module arranged in the stacked structure is set to be lower than the threshold deviation corresponding to a group including a battery module not arranged in the stacked structure.

7. The battery pack diagnosing apparatus according to claim 5,
wherein the instructions are configured to cause the processor to diagnose the state of the battery pack as a defective state, when there is a battery module in which the sum of the number of first target sensors and the number of second target sensors is equal to or greater than a first criterion number among the plurality of battery modules.

8. The battery pack diagnosing apparatus according to claim 5,
wherein the instructions are configured to cause the processor to diagnose the state of the battery pack as a defective state, when there is a group in which the sum of the number of first target sensors and the number of second target sensors corresponding to the plurality of battery modules belonging to the corresponding group is equal to or greater than a second criterion number among the classified groups.

9. The battery pack diagnosing apparatus according to claim 1,
wherein the temperature sensor is provided in plural to be attached to each of the plurality of battery modules, and
wherein the instructions are configured to measure a plurality of temperatures for the plurality of battery modules, respectively, through the temperature sensors.

10. A battery pack, comprising the battery pack diagnosing apparatus according to claim 1.

11. A battery pack diagnosing method, which diagnoses a state of a battery pack including a plurality of battery modules, the method comprising:

measuring, by a processor, a temperature of each of the plurality of battery modules through at least one temperature sensor attached to each of the plurality of battery modules;

classifying, by the processor, the plurality of battery modules into at least one group based on arrangement information for the plurality of battery modules;

diagnosing, by the processor, a first state of each of the plurality of battery modules based on the temperature of each of the plurality of battery modules measured in the temperature measuring step and a threshold temperature set for each group to which the corresponding battery module belongs;

setting, by the processor, a representative temperature for each classified group based on temperatures of battery modules of the plurality of battery modules belonging to the group;

diagnosing, by the processor, a second state of each of the plurality of battery modules based on the temperature of the battery module and the representative temperature of the group to which the battery module belongs; and diagnosing, by the processor, a state of the battery pack according to a diagnosis result of the first state diagnosing step and a diagnosis result of the second state diagnosing step.

* * * * *